US009129081B2

(12) United States Patent
Ginetti et al.

(10) Patent No.: US 9,129,081 B2
(45) Date of Patent: *Sep. 8, 2015

(54) SYNCHRONIZED THREE-DIMENSIONAL DISPLAY OF CONNECTED DOCUMENTS

(75) Inventors: Arnold Ginetti, Antibes (FR); Jean-Noel Pic, Valbonne (FR)

(73) Assignee: Cadence Design Systems, Inc., San Jose, CA (US)

(*) Notice: Subject to any disclaimer, the term of this patent is extended or adjusted under 35 U.S.C. 154(b) by 159 days.

This patent is subject to a terminal disclaimer.

(21) Appl. No.: 13/299,268

(22) Filed: Nov. 17, 2011

(65) Prior Publication Data

US 2013/0246900 A1    Sep. 19, 2013

Related U.S. Application Data

(60) Provisional application No. 61/553,902, filed on Oct. 31, 2011.

(51) Int. Cl.
*G06F 17/00* (2006.01)
*G06F 17/50* (2006.01)
*G06F 17/22* (2006.01)

(52) U.S. Cl.
CPC ........ *G06F 17/5068* (2013.01); *G06F 17/2247* (2013.01); *G06F 17/5045* (2013.01); *G06F 17/5072* (2013.01); *G06F 17/5077* (2013.01); *G06F 17/5081* (2013.01)

(58) Field of Classification Search
CPC ............ G06F 17/5068; G06F 17/5045; G06F 17/5081; G06F 17/2247; G06F 17/5072; G06F 17/5077

USPC .......... 715/225, 212, 243–247; 716/108–134, 716/106, 139
See application file for complete search history.

(56) References Cited

U.S. PATENT DOCUMENTS

| | | | |
|---|---|---|---|
| 7,657,856 B1 * | 2/2010 | Koshy et al. .................. 716/124 |
| 8,156,456 B1 * | 4/2012 | Rahman et al. ............... 716/104 |
| 2005/0138575 A1 * | 6/2005 | Hashimoto et al. ........... 715/815 |
| 2006/0095882 A1 * | 5/2006 | Mankin et al. ................. 716/11 |
| 2006/0224986 A1 * | 10/2006 | Lindsay et al. ............... 715/766 |
| 2009/0024977 A1 * | 1/2009 | Hetzel et al. .................... 716/14 |
| 2009/0113369 A1 * | 4/2009 | Colwell et al. ................ 716/11 |
| 2010/0153888 A1 * | 6/2010 | Jarosz ........................... 715/856 |
| 2010/0205575 A1 * | 8/2010 | Arora et al. ..................... 716/11 |
| 2011/0022987 A1 * | 1/2011 | Brubaker ....................... 715/847 |
| 2011/0145772 A1 * | 6/2011 | Pikus ............................. 716/112 |
| 2012/0131495 A1 * | 5/2012 | Goossens et al. ............. 715/782 |
| 2012/0198409 A1 * | 8/2012 | Zhang et al. .................. 716/132 |

* cited by examiner

*Primary Examiner* — Quoc A Tran
(74) *Attorney, Agent, or Firm* — Kenyon & Kenyon LLP (57) ABSTRACT

A system and method for synchronizing the display and edit of a plurality of connected layouts or documents within a single display. A first document or plurality of elements may be displayed as active and a second document or plurality of elements may be displayed as non-active background in a first window. The second document or plurality of elements may be displayed as active and the first document or plurality of elements may be displayed as non-active background in a second window. Any action detected in either window may be displayed in the other window. Upon selection of any active element or predefined net list, the elements physically or logically connected to the selected element or net list may be highlighted in the active documents, listed, or otherwise identified. An inter-document net list may identify connections between existing net lists in multiple documents.

39 Claims, 11 Drawing Sheets

SYNCHRONIZED THREE-DIMENSIONAL DISPLAY OF CONNECTED DOCUMENTS

CROSS-REFERENCE TO RELATED APPLICATIONS

The present application claims the benefit of the following U.S. Provisional Application Ser. No. 61/553,902, filed Oct. 31, 2011, entitled "Synchronized Three-Dimensional Display of Connected Documents".

BACKGROUND

Aspects of the present invention relate generally to the field of integrated circuit design, and more specifically to displaying and editing stacked designs.

Integrated circuit (IC) design is a complex process, often involving a large number of elements, shapes or geometries, and may be facilitated with an electronic design automation (EDA) tool that allows a designer to interactively position ("place") and connect ("route") various shapes on a circuit. The EDA tool then creates a circuit layout or document containing the physical locations and dimensions of the circuit's components, interconnections, and various layers from the original design that may then be fabricated, creating the IC.

ICs may be designed such that adjacent dies are connected to form a complex package consisting of multiple distinct but connected dies. Dies may be connected either using a wire to connect the contacts between two dies or via one or more micro-bumps placed on each die. When two adjacent dies have overlapping micro-bumps, they can form a connection. Consequently, the placement and alignment of micro-bumps on a die is critical to the effective design of adjacent die in a package. However, the alignment and effect of a micro-bump placement in a first die may not be apparent in an adjacent die where each die is individually displayed, accessed, edited, tested, and validated. Additionally, correcting the alignment of micro-bumps in adjacent die may be difficult when the designer is required to view and independently edit each design layout without specific knowledge of the effect of an edit on the adjacent die. Editing a die in a package may be further complicated where each die is created using a different layout editor or different technology. A designer may then repeatedly access and edit the design layout for each individual die one by one in order to make small changes in the micro-bump placement to correct the micro-bump alignment or to make other element placement adjustments.

Accordingly there is a need in the art for a three-dimensional circuit design editor to more effectively access the design files for multiple dies and to facilitate proper micro-bump alignment, by synchronizing the display and edit of multiple connected dies. Such an editor may be useful in other contexts in which two documents or layouts are shown as connected in some other way besides micro-bumps, where the features themselves are implicated, for example, in respective dies, and where the ability to align two such features may be facilitated by viewing them in the same window, rather than separately.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

A system and method for synchronizing the display of a plurality of connected layouts, designs, or documents within a single document editing application is described. For ease of reference, "document" or "documents" will be referred to herein, but it should be understood that the description applies equally to layouts or designs, including circuit layouts or circuit designs. In the EDA context, the alignment of elements such as micro-bumps is facilitated by embodiments of the present invention. Alignment of other connector elements also is contemplated.

The display of multiple documents may be synchronized by displaying a first document or a first plurality of elements of a first document as an active document or active elements and a second document or a second plurality of elements of a second document as a background document or background elements in a first window. Then displaying the second document or second plurality of elements as active and the first document or first plurality of elements as background in a second window. Then any action detected in either window may be nearly simultaneously displayed in the other window, thereby allowing the user to view in real time the effect or consequence of the action or edit. Therefore providing a synchronized display of multiple connected documents may facilitate the placement and editing of elements in stacked documents and packages.

Similarly, a system and method for displaying connected elements from a plurality of layouts or documents within a single document editing application is described. The display of a plurality of documents may be synchronized across two or more windows as previously described. Then upon selection of any active element, the elements physically connected to the selected element may be highlighted, listed, or otherwise identified. Alternatively, upon selection of a net list predefined for one of the active documents, or the selection of an element identified in a predefined net list, the elements logically connected by definition in the net list may be highlighted, listed, or otherwise identified. To identify the logical connections between documents, an inter-document net list identifying the connections between existing net lists, may be defined. Then the synchronized display of elements connected across multiple documents may facilitate the design, placement, and editing of elements in connected documents.

Figure 1:
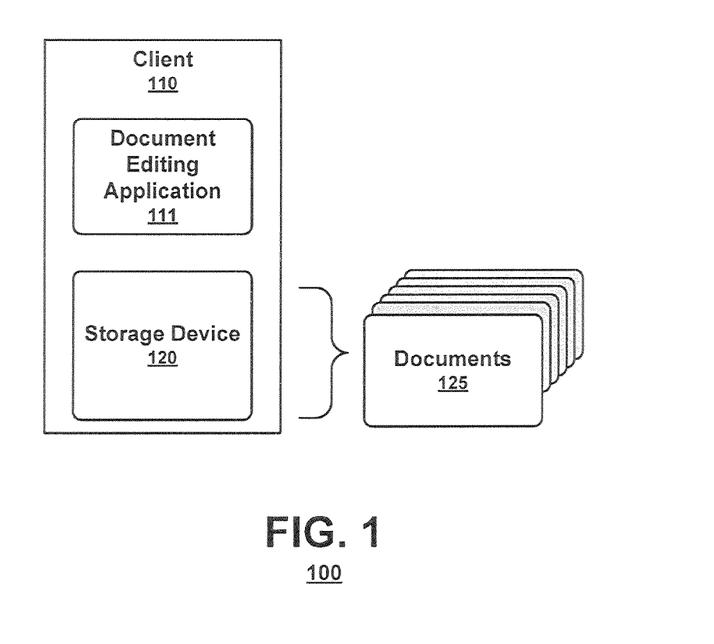
FIG. 1 is a simple block diagram illustrating components of an exemplary system according to an embodiment.

A user may access an integrated circuit design editor or other layout design tool utilizing synchronized three-dimensional display and edit tools in a standalone client system, client-server environment, or a networked environment. FIG. 1 is a simple block diagram illustrating components of an exemplary system 100 according to an embodiment. As shown in FIG. 1, a system 100 may comprise a client 110 executing a document editing application 111, for example a design automation tool and having a memory storage 120. The client 110 may be any computing system that executes a document editing application 111 or otherwise facilitates access to memory storage 120, for example a personal computer. The client 110 may include the processor that performs a method in accordance with the disclosed embodiments. Such a client would be part of an overall document editing system in accordance with the disclosed embodiments.

Documents and other objects 125 utilized by the document editing application 111 may be stored in memory storage 120. Objects 125 stored in memory storage 120 may include elements, shapes, cells, pages, circuits, and layouts that make up packages. A user may access the documents 125 stored in memory storage 120 with the client 110 via document editing application 111 capable of accessing memory storage 120 and displaying the documents 125, packages, and related circuit design data stored therein. The document editing application 111 may include a user interface, for example a program, application or middleware that acts as a frontend to and facilitates access to objects in memory storage 120, for example, a schematic or circuit design editor or other design editing application. The document editing application 111 may facilitate synchronized three-dimensional display and edit of layouts in a package using the display and edit tools and procedures described herein. The user may interact with the document editing application 111 through a number of input devices, such as by inputting a selection as with a mouse or inputting a request as with a keyboard. The user may observe the response to the access request on an output device or display. The document editing application 111 may run in an application window controlled by the user.

As shown in FIG. 1, a client 110 may be a stand-alone system, as may be of particular interest where the designs being developed are highly confidential. Additionally, according to an aspect of an embodiment as shown in FIG. 2, a client 210 may be part of a networked environment.

Figure 2:
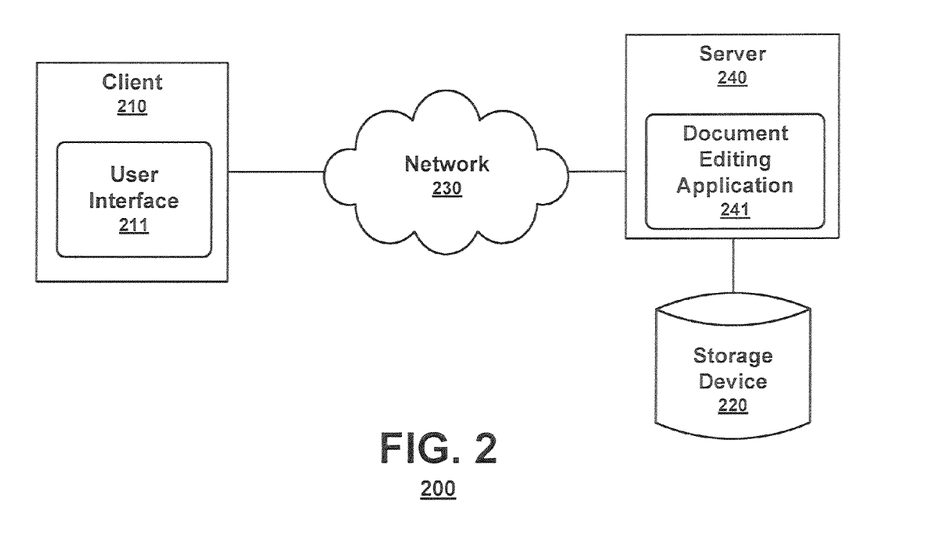
FIG. 2 is a simple block diagram illustrating components of an exemplary system according to an embodiment.

FIG. 2 is a simple block diagram illustrating components of an exemplary system 200 according to an embodiment. As shown in FIG. 2, system 200 may comprise a client 210 having a user interface 211. The client 210 may be connected to a server 240 via a network 230. The document editing application 241, which in this embodiment is in server 240, may have access to storage device 220 storing layouts, documents, packages and other objects utilized by the document editing application 241. The server 240 may include the processor that performs a method in accordance with the disclosed embodiments. Such a server then would be part of an overall document editing system in accordance with the disclosed embodiments A user may access a document editing application 241 at the server 240 via the client 210 having a user interface 211 capable of accessing and displaying stored layouts and object libraries. The client 210 may be any computing system that facilitates the user accessing storage device 220, for example a personal computer. The network 230 may be a wired or wireless network that may include a local area network (LAN), a wireless area network (WAN), the Internet, or any other network available for accessing storage device 220 from the client 210.

The server 240 may be a network server accessible to the client 210 via the network 230 that may manage access to storage device 220. The user interface 211 may receive instructions regarding a layout design from the user and utilizing the objects stored in memory storage 220, facilitate a synchronized three-dimensional display of the documents in a package. Multiple different clients (not shown) may access storage device 220 via the network 230 and request access to the objects stored therein.

In another networked environment, the document editing application may be executed on a network capable client and access the documents, packages and other objects stored in one or more storage devices via a network and communications server.

Figure 3:
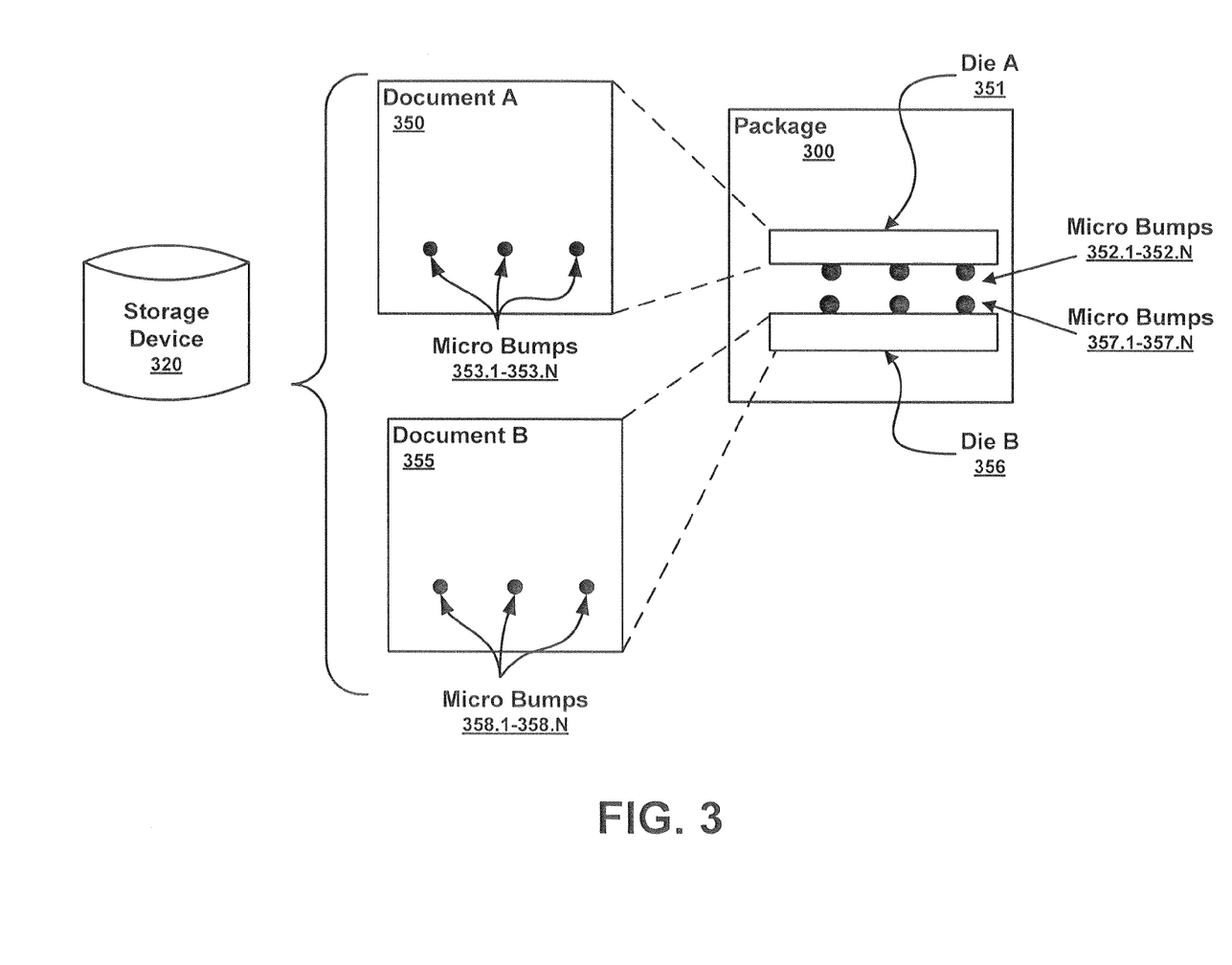
FIG. 3 illustrates an exemplary package stored in an exemplary system for synchronized three-dimensional display and edit according to an embodiment.

FIG. 3 illustrates an exemplary package 300 stored in an exemplary system for synchronized three-dimensional display and edit according to an embodiment. A document editing application may facilitate the three-dimensional display and edit of connected documents in a package 300. For example, one or more individually designed die 351, 356 may be represented by one or more documents 350, 355 stored in a storage device 320. Each document may be stored on a single storage device 320 or on multiple different storage devices (not shown) accessible via a document editing application. Similarly, different documents may be designed with different technologies and therefore may require access to different techfile databases stored on one or more storage devices also accessible via a document editing application.

Each designed die 351, 356 may include one or more micro-bumps 352.1-352.N, 357.1-357.N. The placement of the micro-bumps on each die may be reflected in micro-bumps 353.1-353.N, 358.1-358.N in the respective documents 350, 355. Then, when two separate dies are connected by a micro-bump, the document editing application may display adjacent and connected documents for synchronized display and edit.

According to an aspect of an embodiment, a user may view a first document, e.g. document A 350, and then request a synchronized view of a document connected to document A 350. Then the document editing application may identify and display a second document, e.g. document B 355, as a connected document. The display of the identified connected document with the original document may be consistent with the synchronized display of multiple documents as described herein.

Figure 4:
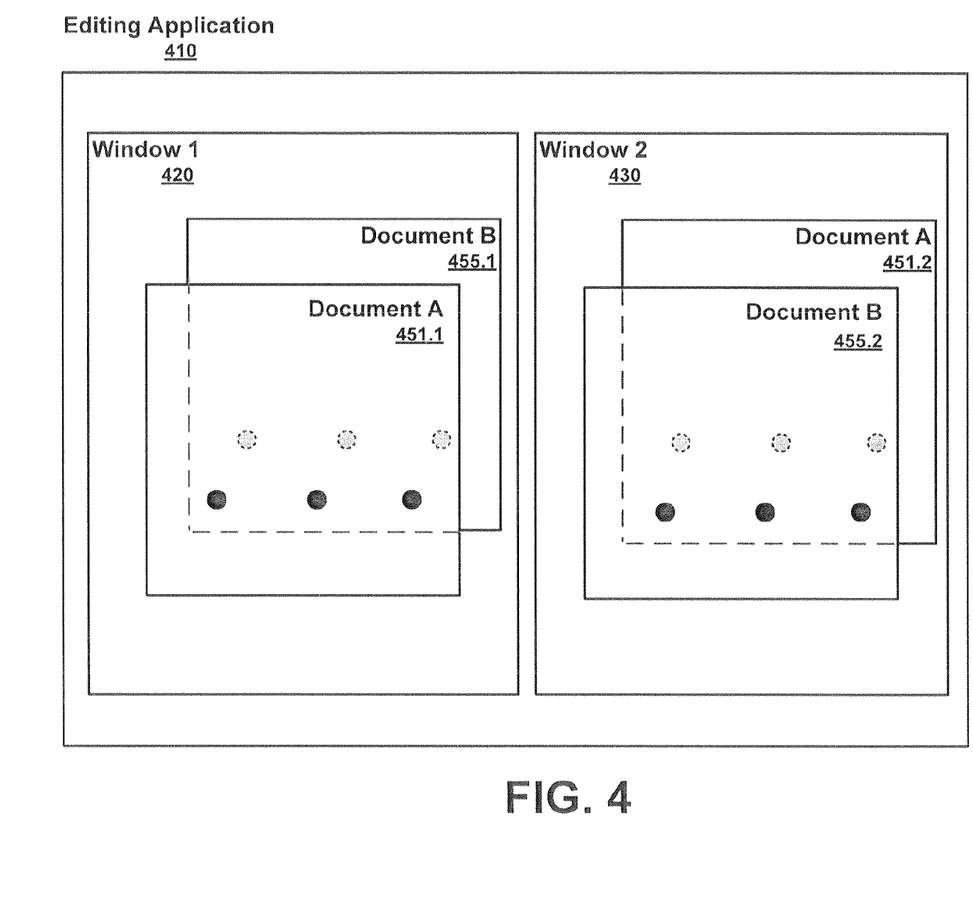
FIG. 4 illustrates an exemplary synchronized three-dimensional display in an exemplary editing application according to an embodiment.

FIG. 4 illustrates an exemplary synchronized three-dimensional display in an exemplary editing application 410 according to an embodiment. As shown in FIG. 4, an exemplary editing application 410 may include multiple display windows 420, 430. Each window 420, 430 may then display multiple documents 451, 455 connected by micro-bumps. For example, as shown in window 1 420, document A 451.1 may be displayed as an active document such that document A 451.1 in window 1 420 may be edited using the edit tools of a document editing application. In window 1 420, document B 455.1 may be displayed as background to document A 451.1. Then alignment adjustments or other edits to document A 451.1 may be made with reference to the elements in document B 455.1 displayed in the background of window 1 420.

Alternatively, elements from document A 451.1 may be displayed as active elements such that the elements in document A 451.1 as shown in window 1 420 may be edited using the edit tools of a document editing application. Then in window 1 420, elements from document B 455.1 may be displayed as background to the elements from document A 451.1. Then alignment adjustments or other edits to the elements of document A 451.1 may be made with reference to the elements in document B 455.1 displayed in the background of window 1 420.

Similarly, document B 455.2, or the elements of document B, may be displayed as active in window 2 430 such that the aspects of document B 455.2 displayed in window 2 430 may be edited using the edit tools of a document editing application. Then document A 451.2, or the elements of document A, may be displayed in window 2 430 as background to document B 455.2 and document B 455.2 may be edited with reference to the elements and shapes displayed in the background as part of document A 451.2.

When an action is performed in an active document in one window, for example, if an active document is edited or the view of an active document is adjusted, a corresponding action may then be displayed in the other windows displaying that document. For example, any edits to document A 451.1 in window 1 420 may be displayed in the background document 451.2 of window 2 430. Similarly, any edits to document B 455.2 in window 2 430 may be displayed in the background document 455.1 of window 1 420.

The display in the background documents of edits made to an active document may appear substantially simultaneously with the original edit. When an edit is implemented, it may be saved and synchronized such that the display of the document in corresponding background documents may be automatically refreshed. Then by immediately viewing the new edit in the background of any connected document, any consequences of the edit to the connected document may be viewed and accommodated or fixed.

According to an embodiment, every element and object implemented as part of document B 455 may be displayed as background in window 1 420. Alternatively, only those elements and objects directly connecting document A 451 to document B 455, for example, the connecting micro-bumps, may be displayed in document B 455.1 in the background of window 1 420. Similarly, only those elements affected by the connection, for example, those elements in document B 455 connected to elements on the active document A 451.1, or some other subset of the elements in document B 455, may be displayed in the background of window 1 420.

A visibility option may be provided such that the user may select a visibility or displayed element density setting, thereby allowing the user to adjust the amount of information shown in each document in a window, for example, by filtering out one or more layers in the visible document. A single layer visibility setting may be adjusted for all windows in an application, or multiple different visibility settings may be adjusted with each visibility setting applicable to a subset of the windows. A visibility adjustment made for an active document, e.g. document A 451.1, in a window, e.g. window 1 420, may be correspondingly displayed in another window, e.g. window 2 430, in which the adjusted document is viewable in the background, e.g. document A 451.2. Then the information displayed in active document A 451.1 is the same information displayed in background document A 451.2.

According to an embodiment, the document editing application may include verification and analysis tools that may analyze a document and identify any potential problems with the document design. When a document is edited, and those edits affect a connected document, the connected document may be analyzed and the results of the analysis may be shown in an active document displayed with the recent edits in a background document.

Figure 5:
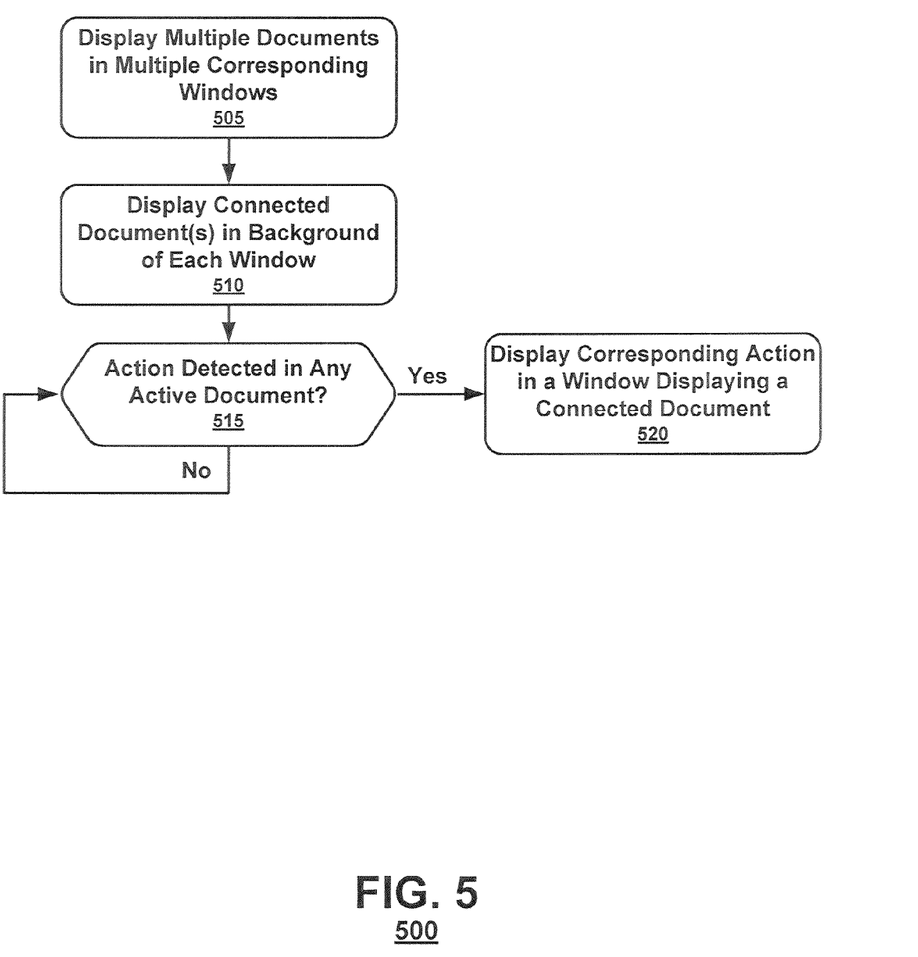
FIG. 5 is a simplified flow diagram illustrating an exemplary method for synchronized edit and display of connected documents.

FIG. 5 is a simplified flow diagram illustrating an exemplary method 500 for synchronized edit and display of connected documents. As shown in FIG. 5, multiple documents may be displayed in multiple corresponding application windows such that each displayed document is the active document in a window (block 505). Then in each window, a document connected to the active document may be displayed as a non-active document in the background of the window (block 510). For any action subsequently detected in an active document (block 515), a corresponding action is displayed in a window having the edited document as a non-active background document (block 520).

Figure 6:
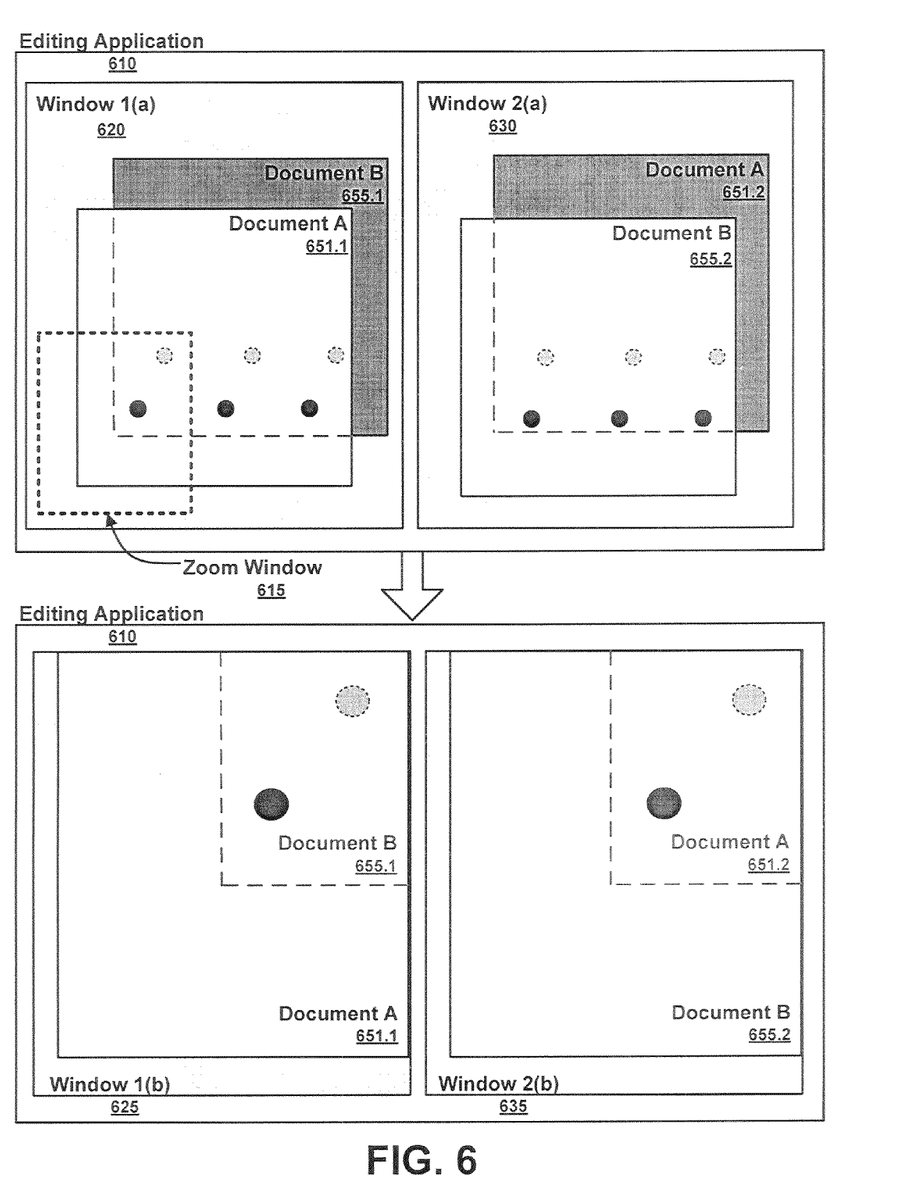
FIG. 6 illustrates an exemplary synchronized three-dimensional display of an action in an exemplary editing application according to an embodiment.

FIG. 6 illustrates an exemplary synchronized three-dimensional display of an action in an exemplary editing application 610 according to an embodiment. As shown in FIG. 6, document A 651.1 may be displayed as an active document in window 1(*a*) 620 and document B 655.1 may be displayed as background to document A 651.1 in window 1(*a*) 620. Similarly, document B 655.2 may be displayed as an active document in window 2(*a*) 630 and document A 651.2 may be displayed as background to document B 655.2 in window 2(*a*) 630.

Any action performed in document A 651.1 in window 1(*a*) 620 may then be displayed in document A 651.2 in the background of window 2. For example, as shown in FIG. 6, when a zoom function is initiated in window 1, a corresponding zoom may be shown in window 2. As shown in window 1(*a*) 620, a zoom function may be initiated with a zoom window 615. The corresponding zoom view is shown in window 1(*b*) 625. Upon detecting the action in window 1, a corresponding action may be displayed for window 2. As shown, the corresponding zoom view is also displayed in window 2(*b*) 635. Similarly, any action in document B 655.2 in window 2(*a*) 630 may be displayed in the background of window 1.

Figure 7:
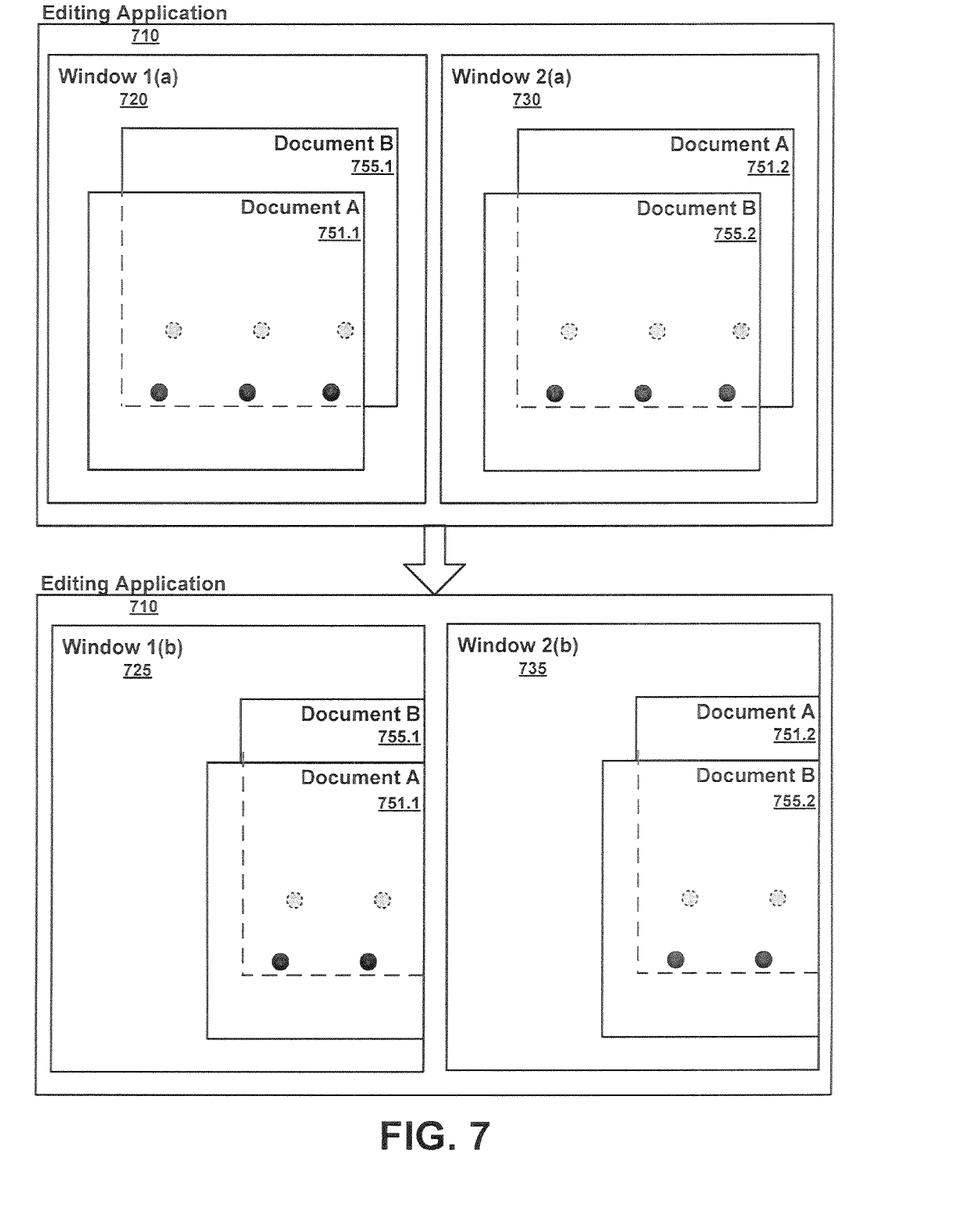
FIG. 7 illustrates an exemplary synchronized three-dimensional display of an action in an exemplary editing application according to an embodiment.

FIG. 7 illustrates an exemplary synchronized three-dimensional display of another action in an exemplary editing application 710 according to an embodiment. As shown in FIG. 7, document A 751.1 may be displayed as an active document in window 1(*a*) 720 and document B 755.1 may be displayed as background to document A 751.1 in window 1(*a*) 720. Similarly, document B 755.2 may be displayed as an active document in window 2(*a*) 730 and document A 751.2 may be displayed as background to document B 755.2 in window 2(*a*) 730.

Any action performed in document A 751.1 in window 1 may then be displayed in document A 751.2 in the background of window 2. For example, as shown in FIG. 7, when a window movement is initiated in window 1, a corresponding movement may be shown in window 2. As shown, a pan function may be initiated on window 1(*a*) 720. The corresponding movement is shown in window 1(*b*) 725. Upon detecting the action in window 1, a corresponding action may be displayed for window 2. The corresponding movement is also displayed in window 2(*b*) 735. Similarly, any action in document B 755.2 in window 2(*a*) 730 may be displayed in the background of window 1.

Figure 8:
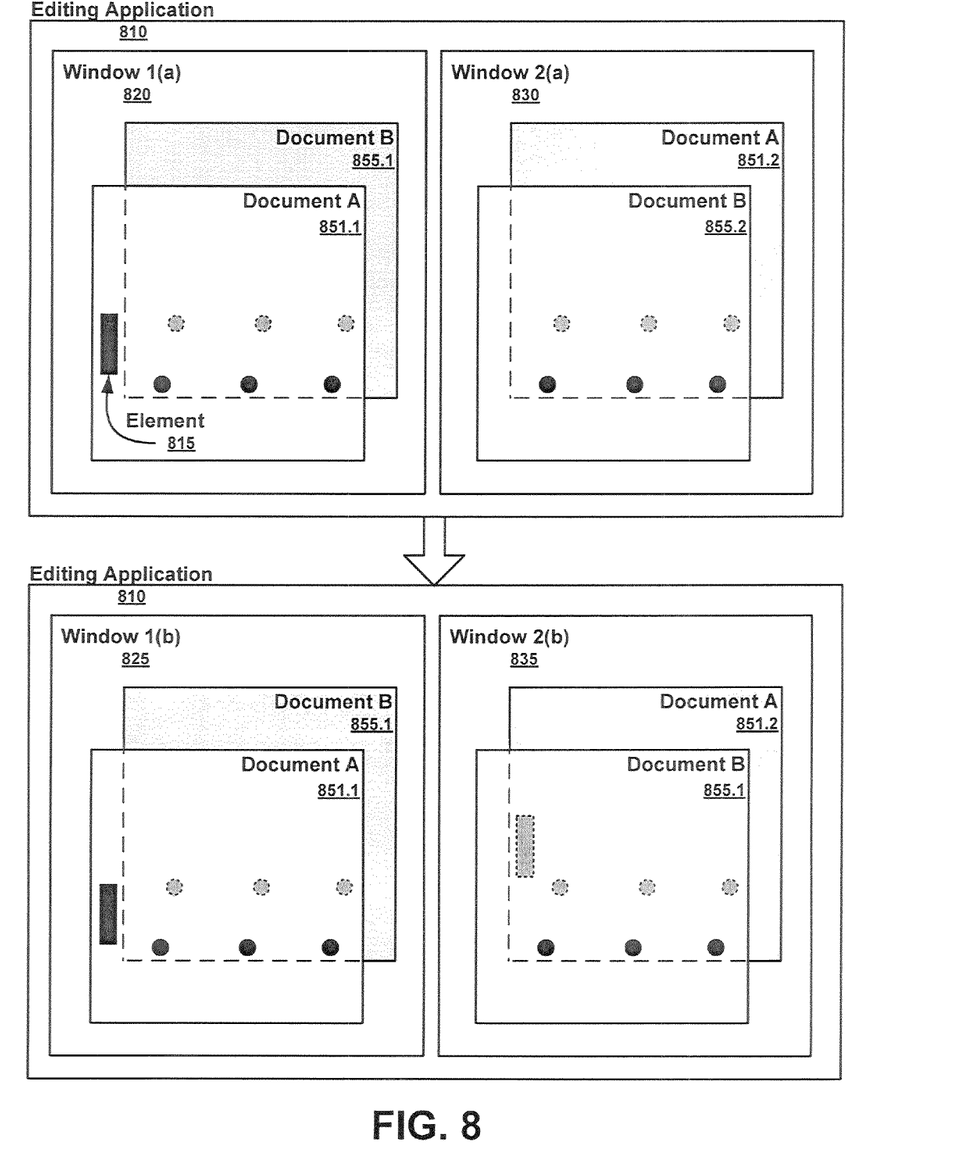
FIG. 8 illustrates an exemplary synchronized three-dimensional display of an action in an exemplary editing application according to an embodiment.

FIG. 8 illustrates an exemplary synchronized three-dimensional display of another action in an exemplary editing application 810 according to an embodiment. As shown in FIG. 8, document A 851.1 may be displayed as an active document in window 1(a) 820 and document B 855.1 may be displayed as background to document A 851.1 in window 1(a) 820. Similarly, document B 855.2 may be displayed as an active document in window 2(a) 830 and document A 851.2 may be displayed as background to document B 855.2 in window 2(a) 830.

Any edit to document A 851.1 in window 1 may then be displayed in document A 851.2 in the background of window 2. For example, as shown in FIG. 8, when an element is added, deleted, moved, or otherwise changed in document A 851.1 in window 1, a corresponding edit may be displayed in document A 851.2 in window 2. As shown in window 1(a) 820, an element 815 may be added to document A 851.1. Upon detecting the edit to window 1, a corresponding element may also be displayed in document A 851.2 in window 2(b) 835. Similarly, any edit to document B 855.2 in window 2(a) 830 may be displayed in the background of window 1.

Although several different edits are described above, these edits should be considered exemplary only. It will be understood that any edit to an active document in a first window may be displayed in a synchronized display of the respective document in the background of a second window.

Figure 9:
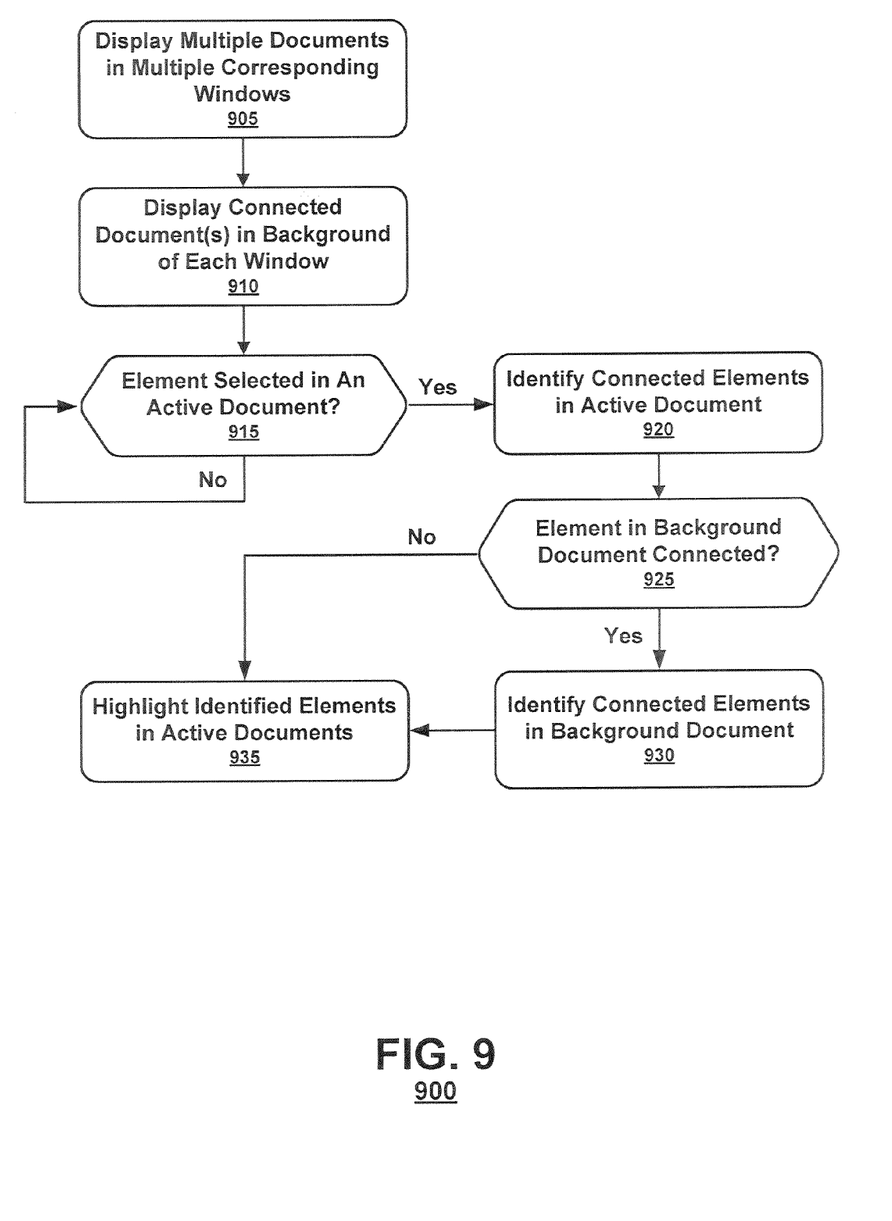
FIG. 9 is a simplified flow diagram illustrating an exemplary method for synchronized three-dimensional display of physically connected elements in connected documents.

Synchronized display of connected documents may additionally facilitate cross document probing. Physical or logical document probing facilitates document design by identifying the elements of a document that are connected either physically or as defined by an element net list. FIG. 9 is a simplified flow diagram illustrating an exemplary method 900 for synchronized three-dimensional display of physically connected elements in connected documents.

As shown in FIG. 9, multiple documents may be displayed in multiple corresponding application windows such that for each window, a single document is identified as the active document (block 905). Then in each window, a document connected to the active document may be displayed as a non-active document in the background of the window (block 910). If an element in an active document is subsequently selected (block 915), elements in the active document connected to the selected element may be identified (block 920). If any elements in a background document are additionally connected to an identified element (block 925), for example, by a micro-bump, then that element, and any element connected to the identified background element may be identified as connected (block 930). After the elements connected to the selected element are identified, they may be highlighted or otherwise displayed in the window containing the active document containing the identified element (block 935).

Figure 10:
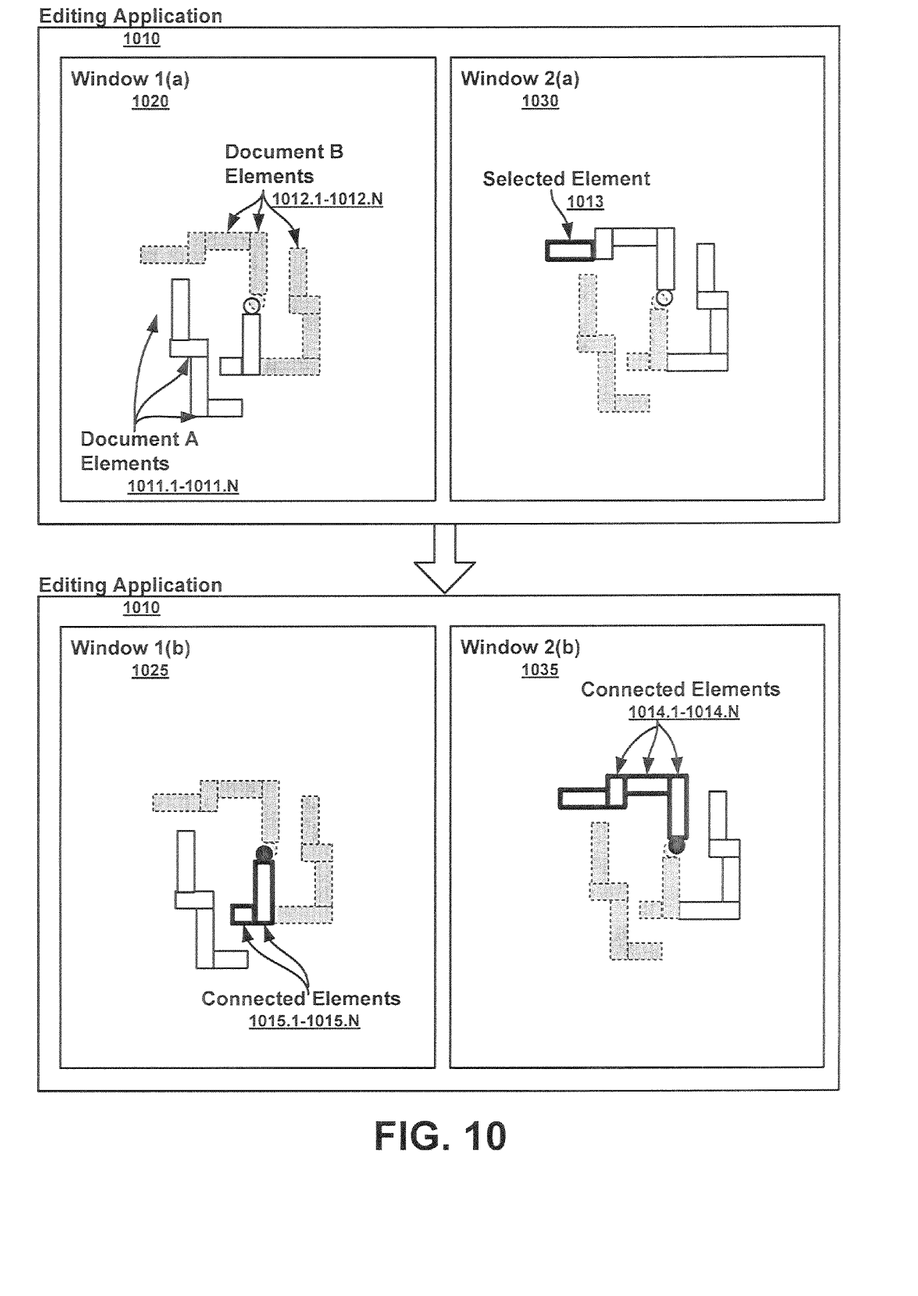
FIG. 10 illustrates an exemplary synchronized three-dimensional display of physically connected elements in an exemplary editing application according to an embodiment.

FIG. 10 illustrates an exemplary synchronized three-dimensional display of physically connected elements in an exemplary editing application 1010 according to an embodiment. As shown in FIG. 10, elements corresponding to document A 1011.1-1011.N may be displayed as active elements in window 1(a) 1020 and elements corresponding to document B 1012.1-1012.N may be displayed as background to document A in window 1(a) 1020. Similarly, elements corresponding to document B 1012.1-1012.N may be displayed as active elements in window 2(a) 1030 and elements corresponding to document A 1011.1-1011.N may be displayed as background to document B in window 2(a) 1030.

Then to probe for elements physically connected to an element, an element may be selected from the active elements. For example, as shown in FIG. 10, element 1013 in window 2(a) 1030 may be selected. As shown in window 2(b) 1035, elements 1014.1-1014.N may be identified as connected to selected element 1013 and each connected element 1014.1-1014.N may be highlighted in window 2(b) 1035 or otherwise identified or listed as connected to selected element 1013.

Additionally, document A and document B may be connected by a micro-bump connected to the selected element 1013. Then as shown in window 1(b) 1025 each element 1015.1-1015.N in document A connected to the micro-bump may additionally be identified as connected to selected element 1013 and each connected element 1015.1-1015.N may be highlighted in window 1(b) 1025 or otherwise identified or listed as connected to selected element 1013.

Figure 11:
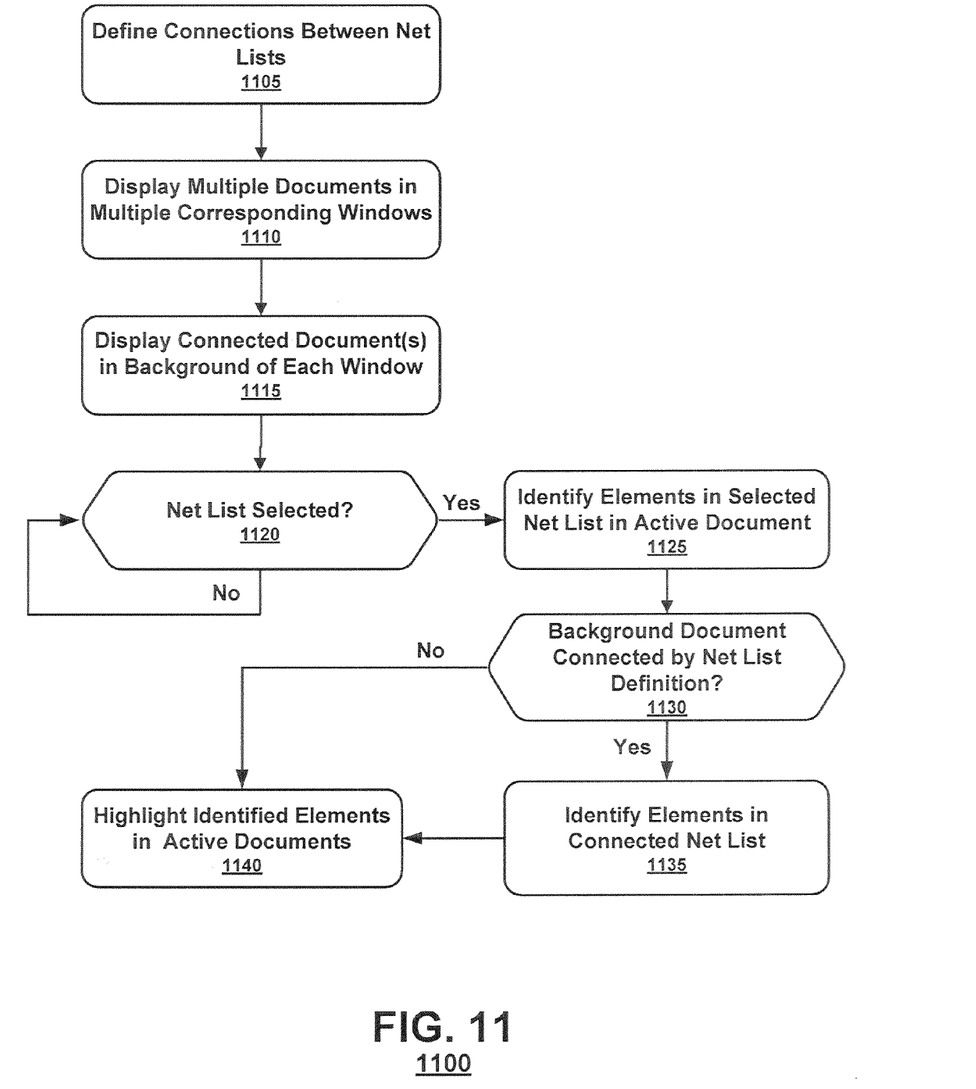
FIG. 11 is a simplified flow diagram illustrating an exemplary method for synchronized three-dimensional display of logically connected elements in connected documents.

Logical probing is similar to physical probing. However, rather than relying on physical connection, the connections between elements are defined in a net list. FIG. 11 is a simplified flow diagram illustrating an exemplary method 1100 for synchronized three-dimensional display of logically connected elements in connected documents.

As shown in FIG. 11, an inter-document net list identifying the connections between the net lists two documents may be defined (block 1105). Then multiple documents may be displayed in multiple corresponding application windows such that for each window, a single document is identified as the active document (block 1110). Then in each window, a document connected to the active document may be displayed as a non-active document in the background of the window (block 1115).

If an element in a defined net list is subsequently selected (block 1120) or if just a net list is selected, elements in the active document connected by definition in the net list may be identified (block 1125). If any elements in a background document are additionally connected to an identified element as defined by the inter-document net list (block 1130), then that element, and any element connected by a predefined net list to the identified background element may be identified as connected (block 1135). Once elements logically connected to the selected element are identified, they may be highlighted or otherwise displayed in the window containing the active document containing the identified element (block 1140).

Figure 12:
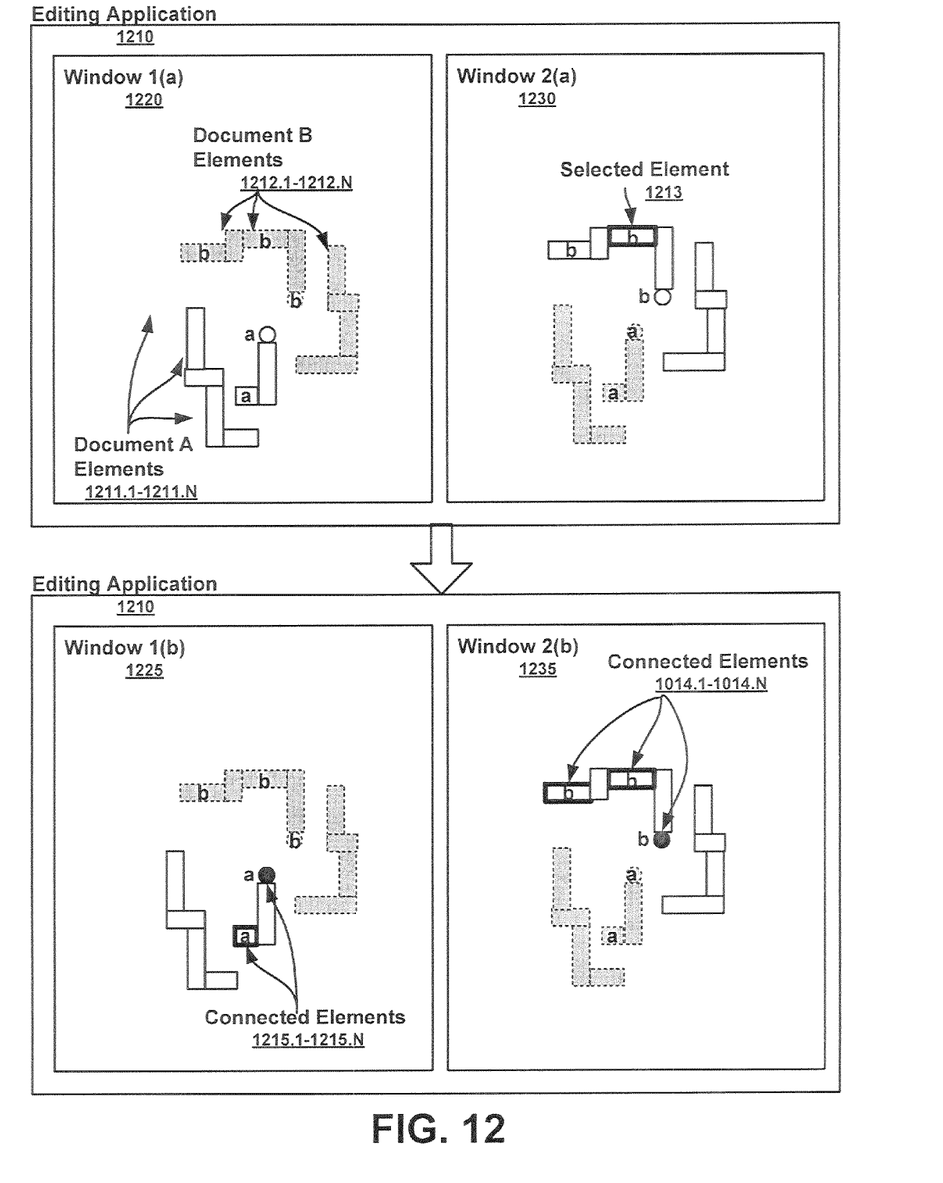
FIG. 12 illustrates an exemplary synchronized three-dimensional display of logically connected elements in an exemplary editing application according to an embodiment.

FIG. 12 illustrates an exemplary synchronized three-dimensional display of logically connected elements in an exemplary editing application 1210 according to an embodiment. As shown in FIG. 12, elements corresponding to document A 1211.1-1211.N may be displayed as active in window 1(a) 1220 and elements corresponding to document B 1212.1-1212.N may be displayed as background to document A in window 1(a) 1220. Similarly, elements corresponding to document B 1212.1-1212.N may be displayed active in window 2(a) 1230 and elements corresponding to document A 1211.1-1211.N may be displayed as background to document B in window 2(a) 1230.

Each document may include a defined net list identifying the logical connections between elements in the document. In FIG. 12, for exemplary purposes, elements identified as part of a net list are shown with a net list label, either as a member of net list a in document A or as a member of net list b in document B. An inter-document net list may be defined by the user that identifies one or more connections between net list a and net list b.

Then, to probe for logically connected elements, an element or net list may be selected from the active elements. For example, as shown in FIG. 12, element 1213, a member of net list b in window 2(a) 1230, may be selected. As shown in window 2(b) 1235, elements 1214.1-1214.N may be identified as part of the selected net list b and may be highlighted in window 2(b) 1235 or otherwise identified or listed as connected to selected element 1213.

Additionally, the connection between document A and document B as defined in an inter-document net list may identify a connection between net list a and net list b, thereby identifying additional elements in document A logically connected to the selected element 1213 in document B. Then as shown in window 1(b) 1225 each net list a element 1215.1-1215.N in document A may be identified and may be highlighted in window 1(b) 1225 or otherwise identified or listed as connected to selected element 1213.

In some applications, the modules described hereinabove may be provided as elements of an integrated software system, in which the blocks may be provided as separate elements of a computer program. Some embodiments may be implemented, for example, using a computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, it is noted that the arrangement of the blocks in FIGS. 5, 9 and 11 do not necessarily imply a particular order or sequence of events, nor are they intended to exclude other possibilities. For example, the operations depicted at blocks 1105, 1110 and 1115 may occur in any order or substantially simultaneously with each other. Such implementation details are immaterial to the operation of the present invention unless otherwise noted above.

The exemplary methods and computer program instructions may be embodied on a computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

Although primarily described implementing synchronized display for editing integrated circuit designs, the disclosed systems and methods may have applicability for editing other types of interconnected but separately created and individually stored documents. While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method using a processor to synchronize display of a plurality of connected documents within a single document editing application, the method comprising:

in a first window in a display, displaying a first plurality of elements of a first document as active elements and a second plurality of elements of a second document as background elements;

in a second window in the display, displaying the second plurality of elements of the second document as active elements and the first plurality of elements of the first document as background elements;

wherein the first document and the second document are integrated circuit design layouts and the single document editing application is a design automation tool and the first document is connected to the second document via an element in the first plurality of elements connected to an element in the second plurality of elements;

wherein the first and second windows are visible in the display at the same time; and upon detecting an action in the first window, displaying a corresponding action in the second window so as to synchronize the display.

2. The method of claim 1, further comprising: editing only the active elements of each window in that window.

3. The method of claim 1, wherein the detected action comprises making at least one edit to an element of the first plurality of elements and said displaying a corresponding action comprises displaying the at least one edit on a corresponding element in the background elements of the second window.

4. The method of claim 1, wherein the detected action comprises displaying a result of a validation analysis of the active elements in the first window.

5. The method of claim 1, wherein the layouts are connected via aligned micro-bumps.

6. The method of claim 1, further comprising:

upon receiving a request to decrease a density of elements displayed in each window, filtering a plurality of elements from the first plurality of elements.

7. The method of claim 1, further comprising:

upon receiving a request to increase a density of elements displayed in each window, adding a plurality of elements from the first document to the first plurality of elements.

8. The method of claim 1, further comprising:

selecting from a plurality of stored documents, a document connected to the first document; and setting the selected document as the second document.

9. A method using a processor to synchronize display of a plurality of connected documents within a single document editing application, the method comprising:

in a first window in a display, displaying a first document as an active document and a second document as a non-active background document;

in a second window in the display, displaying the second document as an active document and the first document as a non-active background document;

wherein the first document and the second document are integrated circuit design layouts and the single document editing application is a design automation tool and the first document is connected to the second document via an element in the first plurality of elements connected to an element in the second plurality of elements;

wherein the first and second windows are visible in the display at the same time; and upon detecting an action in an active document, displaying a corresponding action in a window displaying the active document as a non-active background document so as to synchronize the display.

10. The method of claim 9, further comprising:

selecting from a plurality of stored documents, a document connected to the first document; and displaying the selected document as the second document.

11. A non-transitory computer readable medium storing instructions that when executed by a processor perform a method of synchronizing display of a plurality of connected documents in a single document editing application, the method comprising:

in a first window in a display, displaying a first plurality of elements of a first document as active elements and a second plurality of elements of a second document as background elements;

in a second window in the display, displaying the second plurality of elements of the second document as active elements and the first plurality of elements of the first document as background elements;

wherein the first document and the second document are integrated circuit design layouts and the single document editing application is a design automation tool and the first document is connected to the second document via an element in the first plurality of elements connected to an element in the second plurality of elements;

wherein the first and second windows are visible in the display at the same time; and upon detecting an action in the first window, displaying a corresponding action in the second window so as to synchronize the display.

12. The non-transitory computer readable medium of claim 11, wherein the detected action comprises making at least one edit to an element of the first plurality of elements and said displaying a corresponding action comprises displaying the at least one edit on a corresponding element in the background elements of the second window.

13. The non-transitory computer readable medium of claim 11, further comprising:

selecting from a plurality of stored documents, a document connected to the first document; and setting the selected document as the second document.

14. A system comprising:

a memory to store a plurality of documents;

a display to display a plurality of application windows, each window displaying a plurality of connected documents; and a processor configured to synchronize the display of the plurality of connected documents by:

in a first window in the display, displaying a first plurality of elements of a first document as active elements and a second plurality of elements of a second document as background elements;

in a second window in the display, displaying the second plurality of elements of the second document as active elements and the first plurality of elements of the first document as background elements;

wherein the first document and the second document are integrated circuit design layouts and the single document editing application is a design automation tool and the first document is connected to the second document via an element in the first plurality of elements connected to an element in the second plurality of elements;

wherein the first and second windows are visible in the display at the same time; and upon detecting an action in the first window, displaying a corresponding action in the second window.

15. The system of claim 14, wherein the processor is further configured to only allow edits to the active elements of each window.

16. The system of claim 14, wherein the detected action comprises making at least one edit to an element of the first plurality of elements and said displaying a corresponding action comprises displaying the at least one edit on a corresponding element in the background elements of the second window.

17. The system of claim 14, wherein:

upon receiving a request to adjust a visibility setting of the first window, the controller adjusts a number of elements displayed from the second plurality of elements as background elements in the first window.

18. The system of claim 14, wherein:

upon receiving a request to synchronize the display of a document connected to the first document, the controller:

selects from the plurality of stored documents a document connected to the first document; and sets the selected document as the second document.

19. A computer-implemented method to synchronize display of connected elements in a plurality of connected documents within a single document editing application, the method comprising:

in a first window in a display, displaying a first plurality of elements of a first document as active elements and a second plurality of elements of a second document as background elements;

in a second window in the display, displaying the second plurality of elements of the second document as active elements and the first plurality of elements of the first document as background elements;

wherein the first document and the second document are integrated circuit design layouts and the single document editing application is a design automation tool;

wherein the first and second windows are visible in the display at the same time;

highlighting a third plurality of elements in the first window that are connected, wherein the third plurality is a subset of the first plurality; and highlighting a fourth plurality of elements in the second window that are connected, wherein the fourth plurality is a subset of the second plurality;

wherein an element in the fourth plurality is connected to an element in the third plurality; and wherein said highlighting acts to synchronize the display.

20. The method of claim 19, wherein an element in the third plurality and an element in the fourth plurality are connected physically.

21. The method of claim 20, further comprising:

upon detecting a selection of an element in the first plurality, assigning to the third plurality the selected element and an element in the first plurality connected to the selected element; and assigning to the fourth plurality, an element from the second plurality connected to an element in the third plurality.

22. The method of claim 19, wherein elements of the third plurality are connected by definition in a first net list and elements of the fourth plurality are connected by definition in a second net list.

23. The method of claim 22, wherein the first net list and the second net list are connected by an inter-document net list.

24. The method of claim 23, further comprising:

upon detecting a selection of a net list, assigning to the third plurality connected elements as identified in the selected net list;

identifying a net list that is connected to the selected net list via the inter-document net list; and assigning to the fourth plurality, connected elements as identified in the connected net list.

25. The method of claim 23, further comprising:

upon detecting a selection of an element, identifying a net list listing the selected element;

assigning to the third plurality connected elements identified in the identified net list;
identifying a net list that is connected to the identified net list via the inter-document net list; and
assigning to the fourth plurality connected elements as identified in the connected net list.

26. A non-transitory computer readable medium storing instructions that when executed by a processor perform a method of displaying connected elements in a plurality of connected documents within a single document editing application, the method comprising:
in a first window in a display, displaying a first plurality of elements of a first document as active elements and a second plurality of elements of a second document as background elements;
in a second window in the display, displaying the second plurality of elements of the second document as active elements and the first plurality of elements of the first document as background elements;
wherein the first document and the second document are integrated circuit design layouts and the single document editing application is a design automation tool;
wherein the first and second windows are visible in the display at the same time;
highlighting a third plurality of elements in the first window that are connected, wherein the third plurality is a subset of the first plurality; and
highlighting a fourth plurality of elements in the second window that are connected, wherein the fourth plurality is a subset of the second plurality;
wherein an element in the fourth plurality is connected to an element in the third plurality; and
wherein said highlighting acts to synchronize the display.

27. The non-transitory computer readable medium of claim 26, wherein an element in the third plurality and an element in the fourth plurality are connected physically.

28. The non-transitory computer readable medium of claim 27, further comprising:
upon detecting a selection of an element in the first plurality, assigning to the third plurality the selected element and an element in the first plurality connected to the selected element; and
assigning to the fourth plurality, an element from the second plurality connected to an element in the third plurality.

29. The non-transitory computer readable medium of claim 26, wherein elements of the third plurality are connected by definition in a first net list and elements of the fourth plurality are connected by definition in a second net list.

30. The non-transitory computer readable medium of claim 29, wherein the first net list and the second net list are connected by an inter-document net list.

31. The non-transitory computer readable medium of claim 30, further comprising:
upon detecting a selection of a net list, assigning to the third plurality connected elements as identified in the selected net list;
identifying a net list that is connected to the selected net list via the inter-document net list; and
assigning to the fourth plurality connected elements as identified in the connected net list.

32. The non-transitory computer readable medium of claim 30, further comprising:
upon detecting a selection of an element, identifying a net list listing the selected element;
assigning to the third plurality connected elements as identified in the identified net list;
identifying a net list that is connected to the identified net list via the inter-document net list; and
assigning to the fourth plurality connected elements as identified in the connected net list.

33. A system comprising:
a memory to store a plurality of documents;
a display to display a plurality of application windows, each window displaying a plurality of connected documents; and
a processor configured to synchronize the display of connected elements in the plurality of connected documents within a single document editing application by:
in a first window in the display, displaying a first plurality of elements of a first document as active elements and a second plurality of elements of a second document as background elements;
in a second window in the display, displaying the second plurality of elements of the second document as active elements and the first plurality of elements of the first document as background elements;
wherein the first document and the second document are integrated circuit design layouts and the single document editing application is a design automation tool and the first document is connected to the second document via an element in the first plurality of elements connected to an element in the second plurality of elements;
wherein the first and second windows are visible in the display at the same time;
highlighting a third plurality of elements in the first window that are connected, wherein the third plurality is a subset of the first plurality; and
highlighting a fourth plurality of elements in the second window that are connected, wherein the fourth plurality is a subset of the second plurality;
wherein an element in the fourth plurality is connected to an element in the third plurality; and
wherein said highlighting acts to synchronize the display.

34. The system of claim 33, wherein the elements of the third plurality and the elements of the fourth plurality are connected physically.

35. The system of claim 34, further comprising:
upon detecting a selection of an element in the first plurality, the controller assigns to the third plurality the selected element and an element in the first plurality connected to the selected element and assigns to the fourth plurality, an element from the second plurality connected to an element in the third plurality.

36. The system of claim 33, wherein elements of the third plurality are connected by definition in a first net list and elements of the fourth plurality are connected by definition in a second net list.

37. The system of claim 36, wherein the processor maintains an inter-document net list that defines a connection between the first net list and the second net list.

38. The system of claim 37, wherein:
upon detecting a selection of a net list, the processor assigns to the third plurality connected elements as identified in the selected net list, identifies a net list that is connected to the selected net list via the inter-document net list, and assigns to the fourth plurality connected elements as identified in the connected net list.

39. The system of claim 37, wherein:
upon detecting a selection of an element, the processor identifies a net list listing the selected element, assigns to the third plurality connected elements as identified in the identified net list, identifies a net list that is connected to the identified net list via the inter-document net list; and assigns to the fourth plurality connected elements as identified in the connected net list.

* * * * *